United States Patent
Gemelli et al.

(10) Patent No.: US 7,082,563 B2
(45) Date of Patent: Jul. 25, 2006

(54) AUTOMATED METHOD FOR GENERATING THE CYCLIC REDUNDANCY CHECK FOR TRANSMISSION OF MULTI-PROTOCOL PACKETS

(75) Inventors: Riccardo Gemelli, S. Colombano (IT); Maurizio Corradini, Mortara (IT); Giacomo Accattoli, Civitanova Marche (IT)

(73) Assignee: Italtel S.p.A., Milan (IT)

( * ) Notice: Subject to any disclaimer, the term of this patent is extended or adjusted under 35 U.S.C. 154(b) by 499 days.

(21) Appl. No.: 10/355,727

(22) Filed: Jan. 31, 2003

(65) Prior Publication Data

US 2004/0172582 A1   Sep. 2, 2004

(51) Int. Cl.
*H03M 13/00* (2006.01)
(52) U.S. Cl. .................................................. 714/758
(58) Field of Classification Search ............. 714/781, 714/752, 758, 800–801, 807
See application file for complete search history.

(56) References Cited

U.S. PATENT DOCUMENTS 6,895,545 B1 *   5/2005   Parhi .......................... 714/781
6,912,683 B1 *   6/2005   Rifaat et al. ................. 714/774

* cited by examiner

*Primary Examiner*—Shelly Chase
(74) *Attorney, Agent, or Firm*—Wolf Block Schorr & Solis-Cohen LLP

(57) ABSTRACT

The invention concerns an automated method to generate the Cyclic Redundancy Check, or CRC, of data packets, minimizing computing time, particularly for the transmission of recursively embedded packets in packet-switching networks, particularly able to carry out the calculation even in case the packet length (as number of bits) is not a multiple integer of processed word width. The invention also concerns the CRC and checksum checking and computing machines carrying out the described calculation.

6 Claims, 15 Drawing Sheets

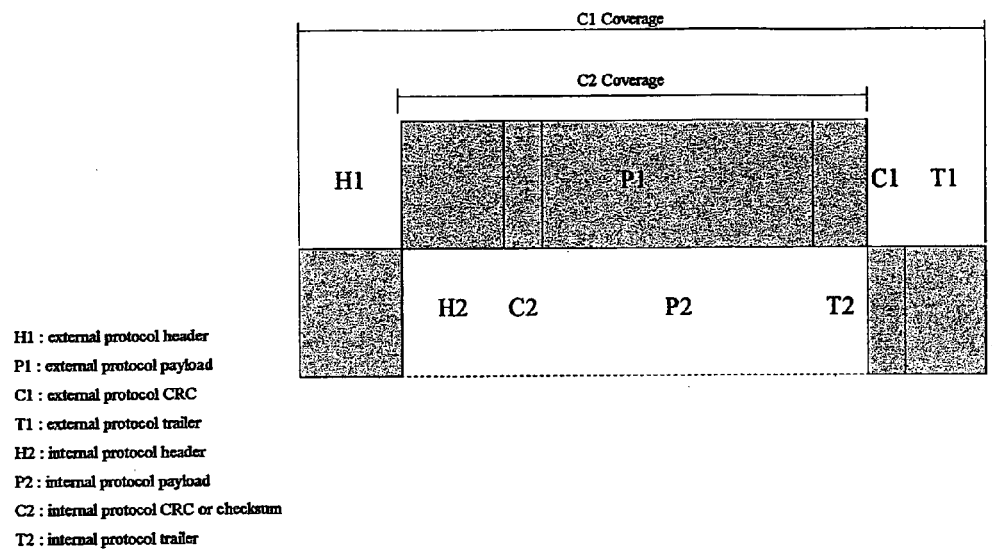
– PRIOR ART –

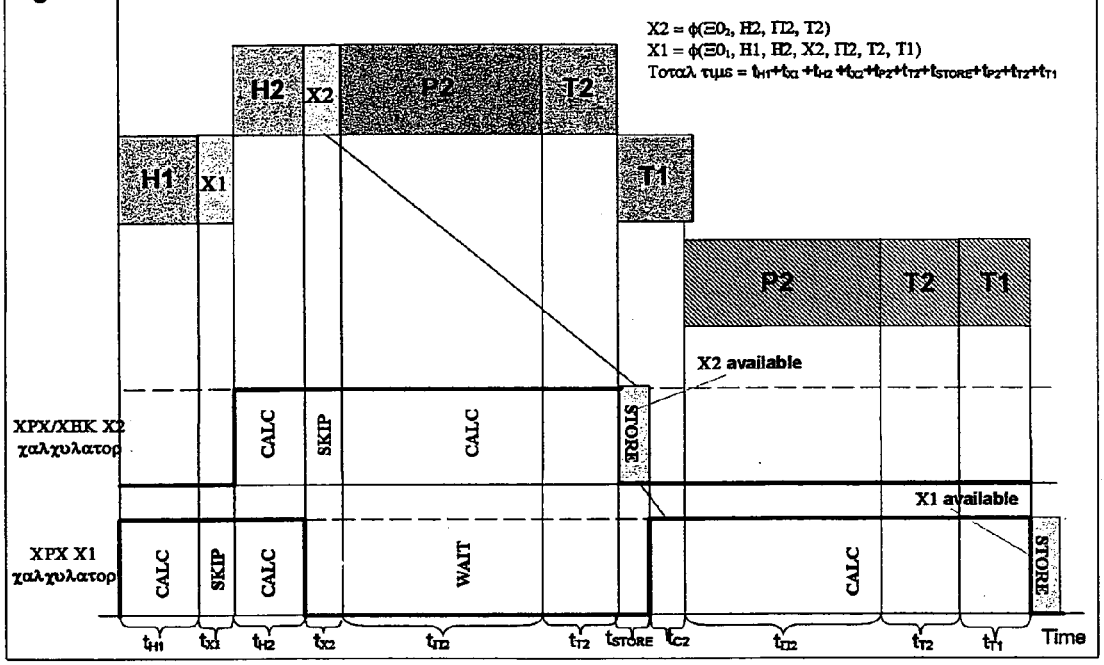
– PRIOR ART –

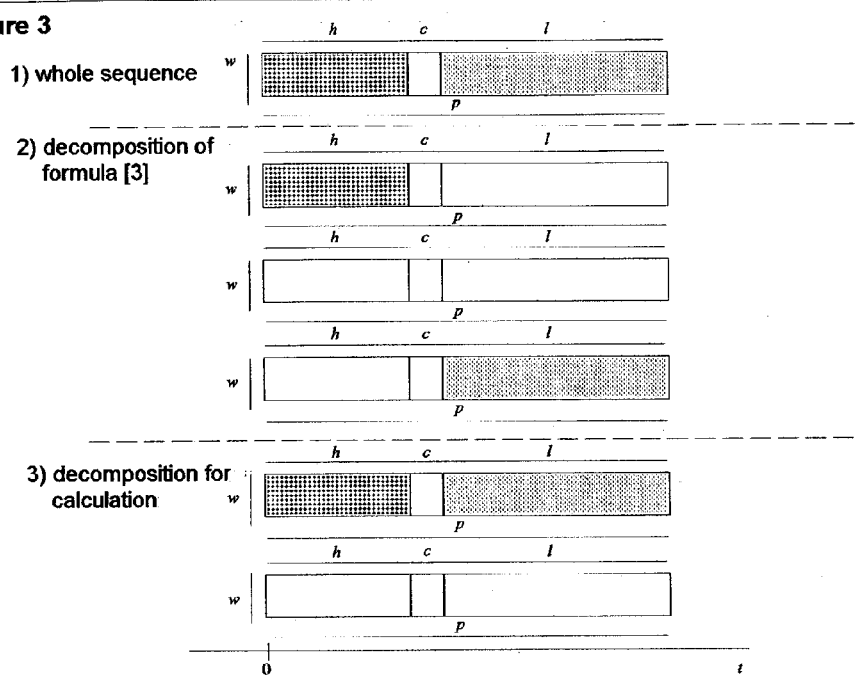

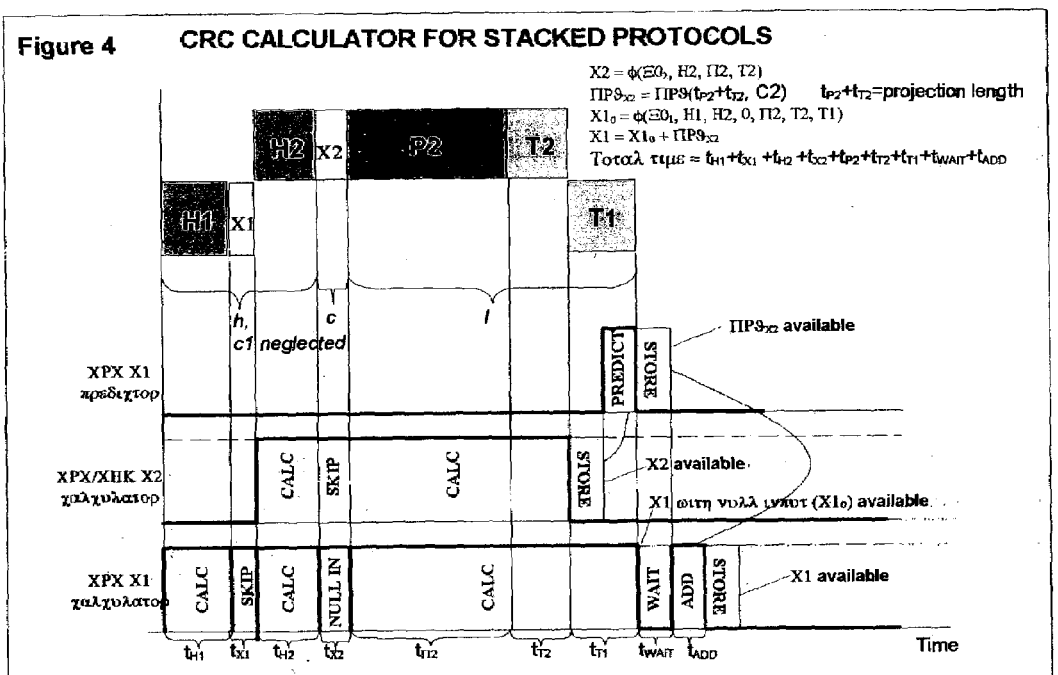
Figure 4 — CRC CALCULATOR FOR STACKED PROTOCOLS

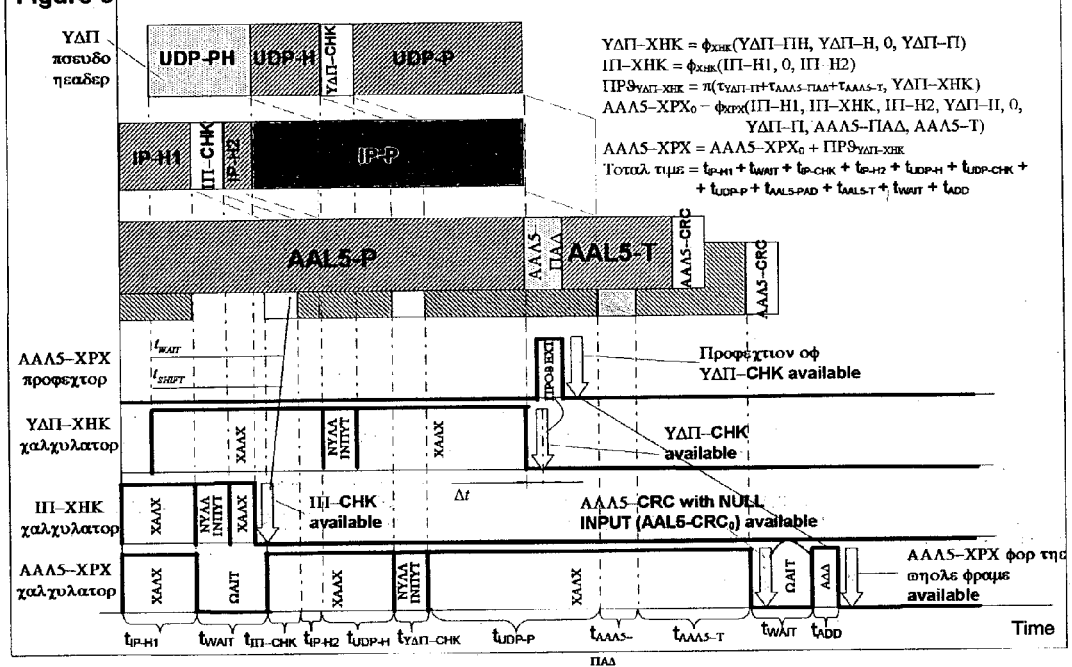

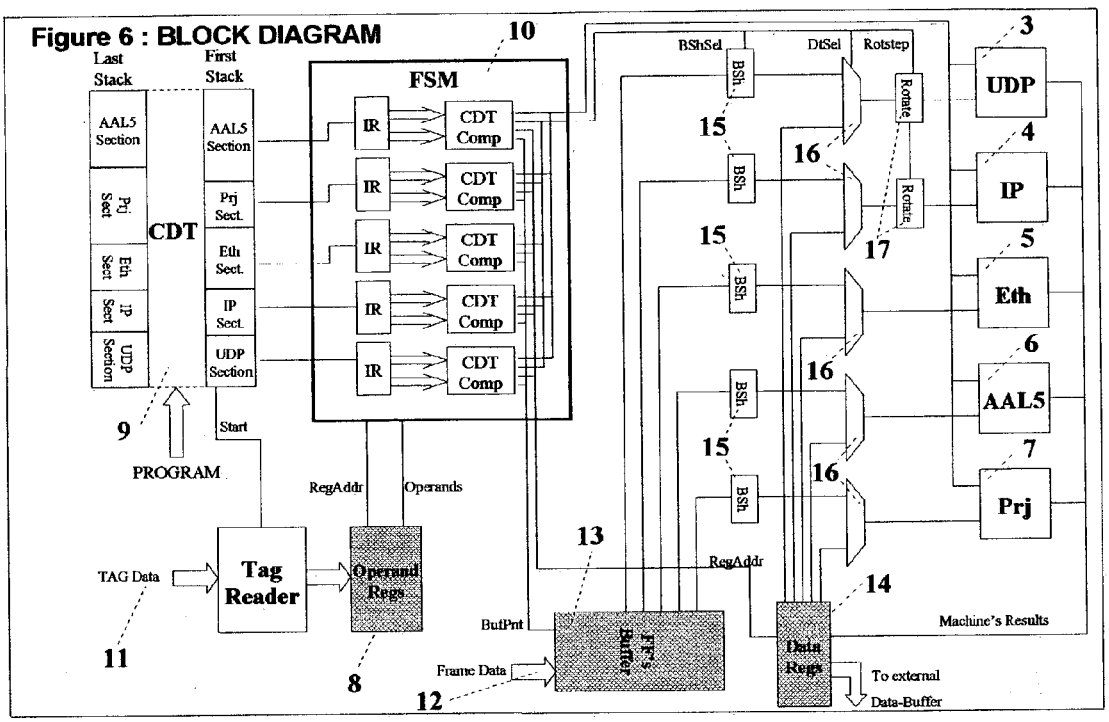

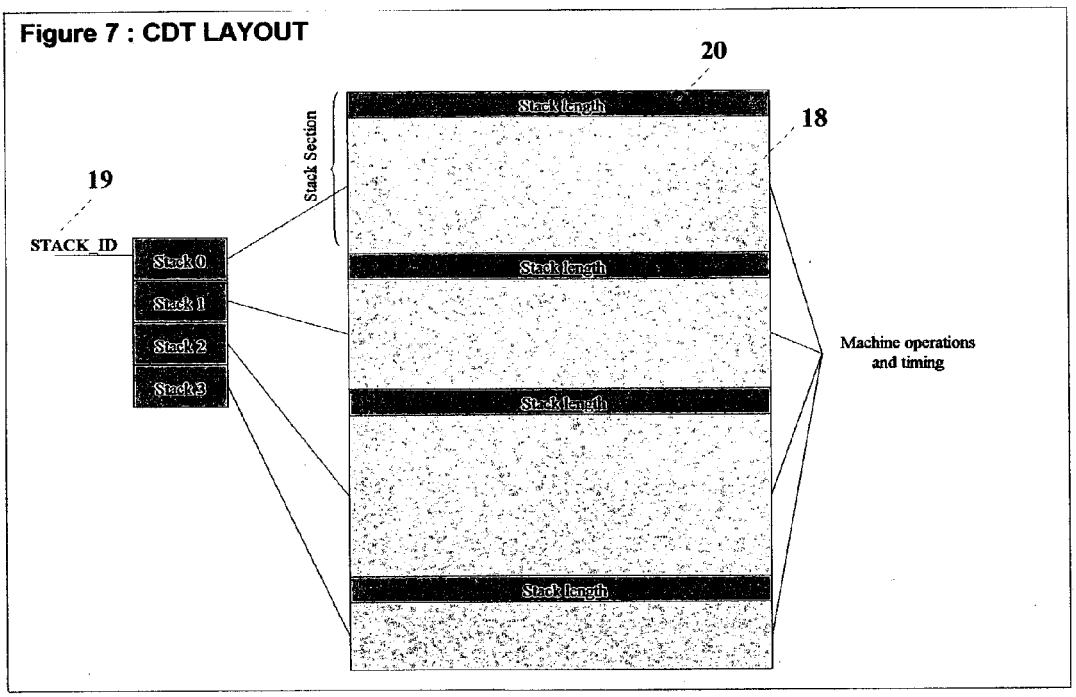

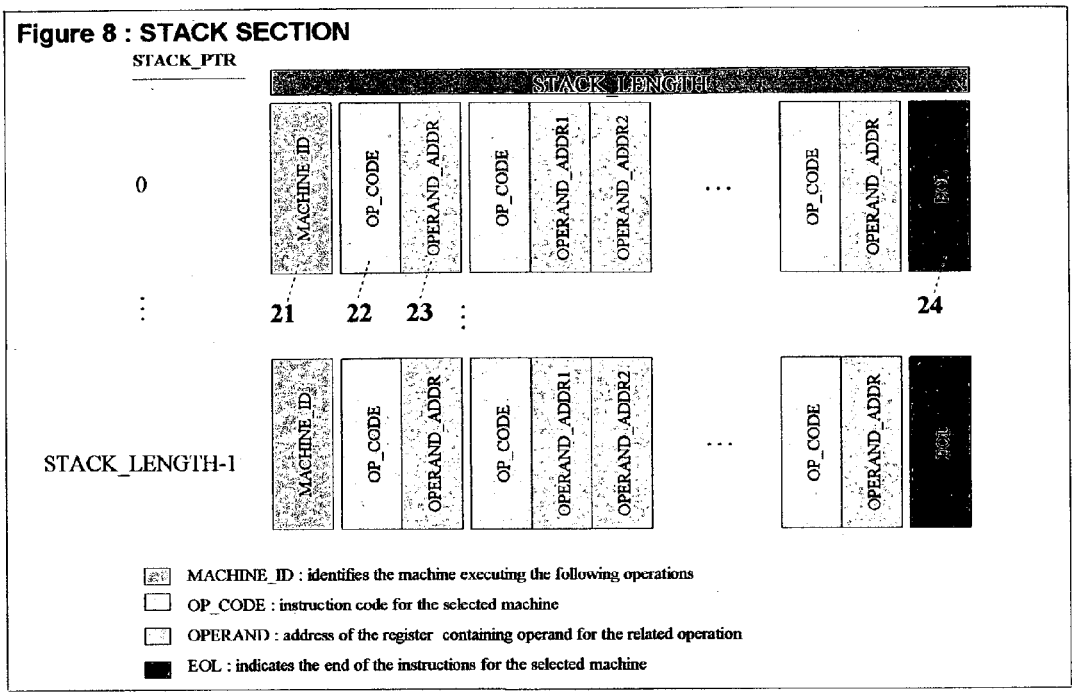

Figure 9:
EXAMPLE : UDP/IP/AAL5 CALCULATE – STACK SECTION DESCRIPTION

| | | | | STACK LENGTH | | | | | |
|---|---|---|---|---|---|---|---|---|---|
| Mach Id [AAL5] | Op Code [Calc] | DtSel [0] | OpLen [R14] | Op Code [Wait] | OpLen [R15] | Op Code [Calc] | DtSel [1] | OpLen [R2] | RegAddr [R4] |
| Op Code [Calc] | DtSel [0] | OpLen [R16] | Op Code [Null In] | OpLen [R8] | Op Code [Calc] | DtSel [0] | OpLen [R17] | Op Code [Add] | DtVal [R20] |
| EOL | Mach Id [IP] | Op Code [Calc] | DtSel [0] | OpLen [R14] | Op Code [Null In] | OpLen [R2] | Op Code [Calc] | DtSel [0] | OpLen [R19] |
| EOL | Mach Id [UDP] | Op Code [Skip] | OpLen [R24] | Op Code [Null In] | OpLen [R26] | Op Code [Calc] | DtSel [0] | OpLen [R25] | Op Code [Calc] |
| DtSel [1] | OpLen [R27] | RegAddr [R28] | Op Code [Calc] | DtSel [0] | OpLen [R5] | Op Code [Skip] | OpLen [R22] | Op Code [Calc] | DtSel [0] |
| OpLen [R23] | Op Code [Null In] | OpLen [R8] | Op Code [Calc] | DtSel [0] | OpLen [R7] | EOL | Mach Id [PRJ] | Op Code [Skip] | OpLen [R18] |
| Op Code [Predict] | PrjLen [R17] | DtVal [R10] | EOL | | | | | | |

EXAMPLE : UDP/IP/AAL5 CALCULATE – PACKET DESCRIPTION

- Each rectangle represents a byte of the packet; for example $H_{IP}(i)$ is the $i$-th byte of the IP header
- N = IP header length expressed as number of bytes
- M = UDP payload length expressed as number of bytes

Figure 11:
EXAMPLE : UDP/IP/AAL5 CALCULATE – REGISTERS DESCRIPTION

This table shows content of registers involved in executing the instructions placed in CDT memory, referring to the UDP/IP/AAL5 stack.

R4, R10 e R20 registers, respectfully, store results of IP, UDP e PRJ calculators; R28 stores UDP packet length.

The others registers store duration (Op Len) of their instructions; this description indicates first and last bytes each instruction involves: for instance, the instruction whose duration has been put in R14 will be executed starting from first ($H_{IP}(0)$) to tenth byte ($H_{IP}(9)$) of the IP header, so OpLen is 10.

Symbol >> means "from byte ... to byte ..."

R2 = IP checksum length = $H_{IP}(10)$ >> $H_{IP}(11)$
R4 = IP checksum value
R5 = (Source IP addr length) + (Dest IP addr length) = $H_{IP}(12)$ >> $H_{IP}(19)$
R7 = UDP payload length = $PL(0)$ >> $PL(M-1)$
R8 = UDP checksum length = $H_{UDP}(6)$ >> $H_{UDP}(7)$
R10 = UDP checksum value
R14 = IP checksum position = $H_{IP}(0)$ >> $H_{IP}(9)$
R15 = $H_{IP}(10)$ >> $H_{IP}(N-1)$
R16 = $H_{IP}(12)$ >> $H_{UDP}(5)$
R17 = $PL(0)$ >> $T_{AAL5}(3)$ R18 = $H_{IP}(0)$ >> $PL(M-1)$
R19 = $H_{IP}(12)$ >> $H_{IP}(N-1)$
R20 = Prj result
R22 = $H_{IP}(20)$ >> $H_{IP}(N-1)$
R23 = $H_{UDP}(0)$ >> $H_{UDP}(5)$
R24 = IP protocol-field position – 2 = $H_{IP}(0)$ >> $H_{IP}(7)$
R25 = IP protocol-field length = $H_{IP}(9)$ >> $H_{IP}(9)$
R26 = IP time to live-field length = $H_{IP}(8)$ >> $H_{IP}(8)$
R27 = UDP length-field length = $H_{UDP}(4)$ >> $H_{UDP}(5)$
R28 = UDP message length

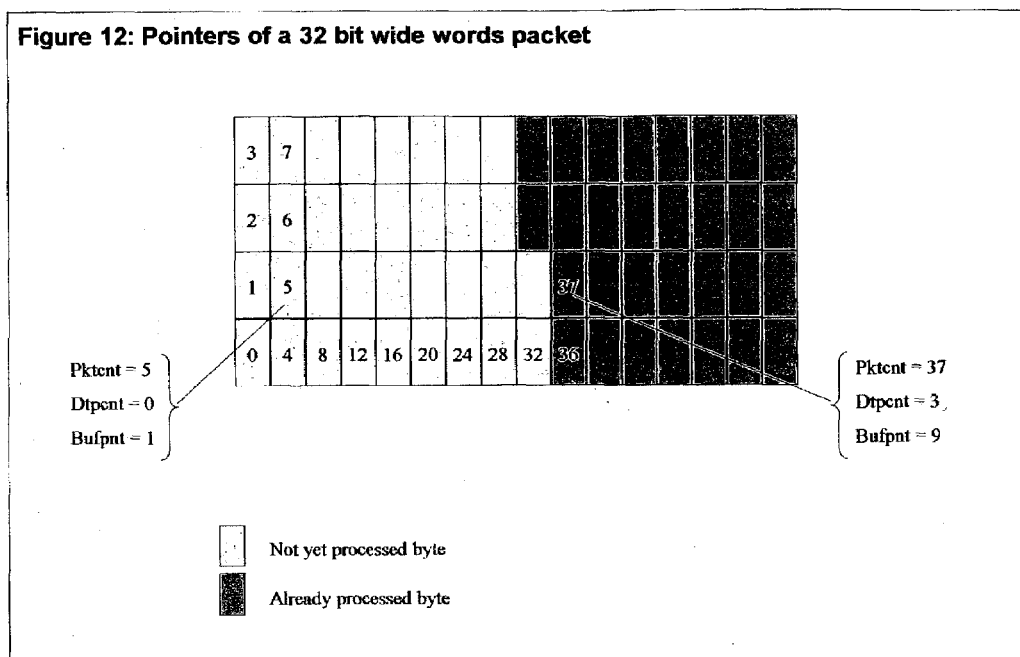

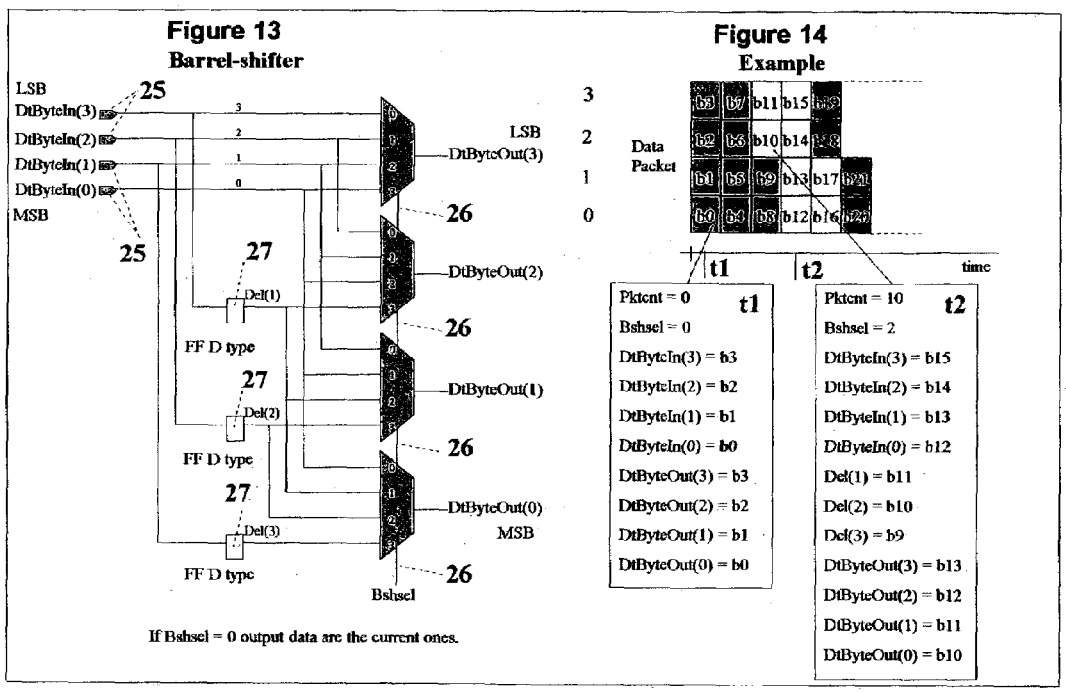

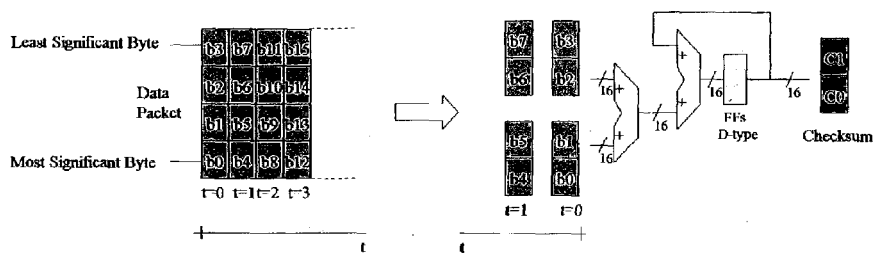
Figure 15: Checksum computation
Checksum is a 16-bit word (two bytes: C0 e C1) given by the 1's complement of the 1's complement sum of all the 16-bit words involved in the calculation.
At time t=0, C0 e C1 bytes are set to 0. Notice that the final result of a checksum calculation depends on the position of each byte with respect to all the others, within the word to be processed.

Figure 16: Data-Rotate

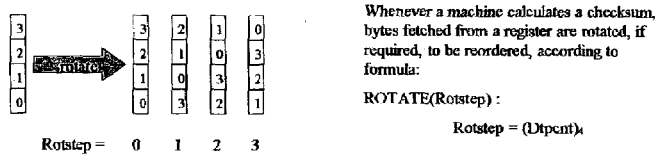

Whenever a machine calculates a checksum, bytes fetched from a register are rotated, if required, to be reordered, according to formula:

ROTATE(Rotstep):

$$Rotstep = (Dtpcnt)_4$$

Figure 17: Example

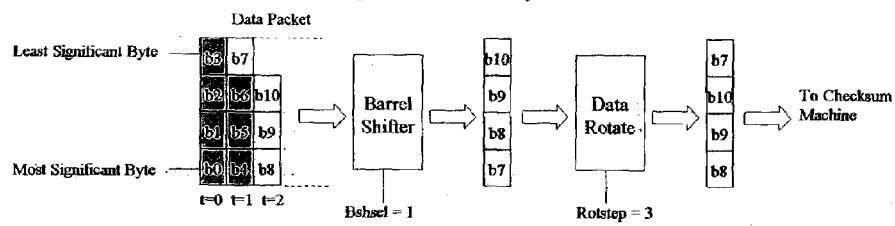

Let's suppose that, at a certain moment, a checksum processor has to process a word composed of the b7, b8, b9, b10 bytes. Barrel Shifter output data cannot be correctly interpreted because its bytes are not in the right position: in fact, for example, b7 is in the MSB position instead of the LSB one. Data Rotate block restores the right byte weight.

AUTOMATED METHOD FOR GENERATING THE CYCLIC REDUNDANCY CHECK FOR TRANSMISSION OF MULTI-PROTOCOL PACKETS

BACKGROUND OF THE INVENTION

This invention concerns an automated method to generate the Cyclic Redundancy Check, or CRC, particularly for the transmission of multi-protocol packets in packet-switching networks, and to minimize CRC computing time for packets including a stack of protocols, this method always being simple, reliable and efficient.

This invention also concerns the necessary tools to implement the method and all the equipments working in accordance to the method. This method can be implemented on network nodes via dedicated processing machines.

It is well known that the telecommunications industry is currently dominated by the internet, whose protocol (IP) requires messages to be suitably processed and transmitted via a stack of different protocols structured into a certain number of independent levels for data transmission.

The message to be transmitted is inserted in a packet or datagram composed of three different portions: 1) the payload, containing the message itself; 2) the header and 3) the trailer. The header and/or the trailer contain some service information, such as the type of data/packet and the IP address of the sender and receiver, and the so-called Frame Check Sequence (FCS) in order to check for proper transmission or to safeguard some specific fields of the packet.

Owing to the required number of protocols, a packet may constitute the payload for a lower level packet in the Open System Interconnect (OSI) stack, making up the cited protocol stack.

As already mentioned, transmission error detection techniques are provided in order to allow the receiver of a message, transmitted via a noisy channel (which introduces errors), to assess whether the message received has been corrupted during transmission. For these purposes, the transmitter calculates a value, called FCS, that is a function of the message and attaches it to the message being sent. The FCSs generally belong to two distinct classes characterized by different properties and computing methods respectively called checksum and Cyclic Redundancy Check (CRC) algorithms. The FCSs calculated via CRC algorithms leave the data to be transmitted intact and add a particular control word, called CRC, at the end. Therefore, for calculating the CRC, the part of the packet whose proper transmission must be checked is sent to a CRC computer that will generate the result as soon as it receives the final data. This activity is usually carried out in serial mode, so that the flow of bits enters the linear feedback shift register (LFSR) and, after the last bit has entered, an outgoing flow with the resulting CRC will be produced. In particular, the CRC depends on the characteristic generator polynomial of the LFSR.

Given a sequence of k ($\geq 1$) input bits or scalars $u[t_0]$, $u[t_0+1]$, $u[t_0+2]$, ..., $u[t_0+k]$, representing the binary data for the LFSR input, and an n degree generator polynomial, the CRC calculation on the input data depends on the initial state $\underline{x}[t_0]$ of the LFSR and on the input sequence:

$$CRC = f(\underline{x}[t_0], u[t_0], u[t_0+1], \ldots, u[t_0+k])$$

In fact, supposing $\underline{x}[t_0]$ is known, given a positive integer w less than or equal to k, we obtain:

$$\underline{x}[t_0+1] = A \cdot \underline{x}[t_0] + \underline{b} \cdot u[t_0]$$
$$\underline{x}[t_0+2] = A \cdot \underline{x}[t_0+1] + \underline{b} \cdot u[t_0+1]$$
$$\vdots$$
$$\underline{x}[t_0+w] = A \cdot \underline{x}[t_0+w-1] + \underline{b} \cdot u[t_0+w-1]$$

where:

$\underline{x}[t_i]$ is the state vector (n,1) of the linear system described by the above equations referred to instant $t_i$;

A is the state matrix (n,n) of the system, whose elements depend on the coefficients of the generator polynomial;

b is a vector (n,1) of the type $\underline{b} = [1\ 0\ 0\ \ldots\ 0]^T$.

Substituting the (i−1)th equation in the i-th equation iteratively, we obtain the following compact form:

$$\underline{x}[t_0+1] = A \cdot \underline{x}[t_0] + \underline{b} \cdot u[t_0]$$

$$\underline{x}[t_0+2] = A \cdot \underline{x}[t_0+1] + \underline{b} \cdot u[t_0+1]$$
$$= A \cdot (A \cdot \underline{x}[t_0] + \underline{b} \cdot u[t_0]) + \underline{b} \cdot u[t_0+1]$$
$$= A^2 \cdot \underline{x}[t_0] + A^1 \cdot \underline{b} \cdot u[t_0] + \underline{b} \cdot u[t_0+1]$$
$$\vdots$$
$$\underline{x}[t_0+w] = A \cdot \underline{x}[t_0+w-1] + \underline{b} \cdot u[t_0+w-1]$$
$$= A^w \cdot \underline{x}[t_0] + A^{w-1} \cdot \underline{b} \cdot u[t_0] + A^{w-2} \cdot \underline{b} \cdot u[t_0+1] + \ldots +$$
$$A^0 \cdot \underline{b} \cdot u[t_0+w-1]$$

where $A^0 = I$ is the identity matrix and $A^i$ is the i-th power of A.

This compact form underlies a "parallel" computation method of CRC that is very useful in several applications. The following description is made on the assumption that the CRC computation is being carried out w bit at a time, so that the CRC calculation on the whole input sequence of k samples will be carried out in k/w steps, where k is a multiple of w. This simplifying hypothesis is not determining for illustrating the procedure and will in any case be removed later on.

As regards the computation method, in real applications, the input sequence may be processed in several steps, each of them operating on a subsequence of the overall sequence, as shown below.

Now, defining a binary vector $\underline{u}_w[t]$ collecting the values of u from instant t to instant t+w−1 of the generic subsequence of length w (t coincides with $t_0$ only for the first subsequence)

$$\underline{u}_w[t] = \begin{bmatrix} u[t] \\ u[t+1] \\ \vdots \\ u[t+w-1] \end{bmatrix}$$

the expression of the state vector becomes $$\underline{x}[t+w] = A^w \cdot \underline{x}[t] + B_w \cdot \underline{u}_w[t]$$

where $B_w$ is a matrix of dimensions (n,w) defined as $$B_w = [A^{w-1} \cdot \underline{b} \mid A^{w-2} \cdot \underline{b} \mid \ldots \mid A^0 \cdot \underline{b}]$$

where each column of $B_w$ is the first column of the matrices $A^i$ (for i=0 ... w−1). Thus, by representing in the compact form each subsequence of length w, we obtain the following representation $$\underline{x}[t_0 + 1 \cdot w] = A^w \cdot \underline{x}[t_0] + B_w \cdot \underline{u}_w[t_0]$$

$$\underline{x}[t_0 + 2 \cdot w] = A^w \cdot \underline{x}[t_0 + w] + B_w \cdot \underline{u}_w[t_0 + w]$$

$$\vdots$$

$$\underline{x}[t_0 + (i+1) \cdot w] = A^w \cdot \underline{x}[t_0 + i \cdot w] + B_w \cdot \underline{u}_w[t_0 + i \cdot w]$$

$$\vdots$$

$$\underline{x}[t_0 + (k/w) \cdot w] = A^w \cdot \underline{x}[t_0 + ((k/w) - 1) \cdot w] +$$

$$B_w \cdot \underline{u}_w[t_0 + ((k/w) - 1) \cdot w]$$

The last equation represents the state vector after k/w steps (as a function of the previous step) defined as the CRC of the input sequence according to the associated generator polynomial.

The value of CRC may be rewritten as a function only of the initial state and of the input sequence by iterative substitution of state i by its expression as a function of state i−1. By carrying out the described substitution and putting p=k/w and $t_0=0$, without losing the generality, we obtain $$\underline{x}[p \cdot w] = A^{p \cdot w} \cdot \underline{x}[0] + \sum_{i=0}^{⍰} A^{(p-1-i)w} \cdot B_w \cdot \underline{u}_w[i \cdot w]. \quad [0]$$

⍰ indicates text missing or illegible when filed

Thus, the CRC may be obtained by iterating k/w=p times the following matrix form:

$$\underline{x}[t_0+(i+1)\cdot w] = A^w \cdot \underline{x}[t_0+i \cdot w] + B_w \cdot \underline{u}_w[t_0+i \cdot w] \quad [1]$$

$$CRC = \underline{x}[t_0+(k/w)\cdot w] = \underline{x}[p \cdot w] \quad [2]$$

where:
$\underline{x}$ is the LFSR state vector, of dimension (n,1), already introduced;
$A^w$ is the already defined matrix (n, n);
$B_w$ is the already defined matrix (n, w).

The value of the elements of matrices $A^w$ and $B_w$ depends on the generator polynomial.

The calculation may thus be performed in k/w clock cycles with a period w times greater than the one of the serial computer that is able to process the same amount of data at the same time.

If k is not a multiple of w, then we proceed—as in the case already described—by first iterating matrix form [1] m times to obtain state $\underline{x}[t_0+m\cdot w]$, and then reusing it as the initial state in the following formula that is similar to [1] but which operates on k−m·w bit parallel data $$\underline{x}[t_0+k] = A_{k-m\cdot w} \cdot \underline{x}[t_0+m\cdot w] + B_{k-m\cdot w} \cdot \underline{u}_{k-m\cdot w}[t_0+m\cdot w]. \quad [1A]$$

where m is the integer quotient of k/w, and k−m·w is the remainder of the division of k by w.

In the case of a protocol stack, the CRC is calculated for each nested protocol, with the result that the CRC of lower level protocols, which include higher level protocols, depends on the CRCs of the nested protocols.

Since the CRCs (or checksums) of the internal protocols may be part of the sequence of data processed by the protocol containing them, the CRC calculation of the external protocol must be suspended until the aforesaid values become available. Usually, first one calculates the higher level CRC, then the one immediately below and so on up to the most external one.

These solutions call for a considerable amount of time because a complete processing is necessary for each level of the stack, and this means long waiting time in order to complete the CRC calculation of the higher level protocols before going on to calculate the CRC of the lower level protocol. In particular, the total time required by the CRC calculation is roughly proportional to the number of levels of the protocol stack.

Hence, in many cases, the lowest level protocol CRC calculation requires a significantly longer time than the actual duration of the packet.

As an example, see FIG. 1, which shows a stack of two protocols. Supposing that CRC (or checksum) C2 of the internal protocol is calculated on the data contained in header H2, in payload P2 and in trailer T2 of the protocol itself; CRC C1 of the external protocol covers H1, P1 and T1, where payload P1 is composed of all the higher protocol data. Note that payload P1 contains C2, that is the FCS of another protocol; moreover, C2 must be calculated on a significant part (P2+T2) of the data following it and thus, in order to complete the calculation, in any case it will be necessary to wait until all the packet (P2+T2) is available.

The network processors available on the market calculate C1 and C2 as shown in FIG. 2, which illustrates the state of activity of the computing machines in the time domain to obtain the CRC C1 as a final result. The purpose of FIG. 2 is to highlight the total calculation time in the aforesaid "traditional" mode.

The machine that calculates C2 starts operating at H2 and finishes at the end of T2; at this point, the value of C2 is available.

The machine that calculates C1 starts processing at H1 but must stop before C2 and can only resume when this field is available, because the result of the calculation of a CRC on a certain data sequence, unlike checksums, depends on the order in which data arrive.

In FIG. 2, the CRC C1 and CRC C2 are expressed according to the definition of function f introduced previously: CRC=f($\underline{x}[t_0]$, u[$t_0$], u[$t_0$+1], ..., u[$t_0$+k]). In FIG. 2, the arguments of f for calculating C2 are in the following order: the initial state $X0_2$ of the computing machine, the packet header H2, the packet payload P2 and the packet trailer T2. The same formula applies for calculating C1.

As FIG. 2 shows, the time that goes by before the external CRC C1 is available is the sum of the duration of the whole frame (H1+C1+P1+T1) and of the duration of the internal packet data following the internal CRC (or checksum) C2 (P2+T2).

BRIEF SUMMARY OF THE INVENTION

This invention thus aims to generate the CRCs of embedded packets in packet-switching networks, minimizing the CRC calculation time for packets including a stack of protocols.

The specific item of this invention is an automated method for generating the Cyclical Redundancy Control, or CRC, of a data packet, particularly for the transmission of embedded packets in packet-switching networks where a CRC is calculated via a LFSR, which performs the calculation of a n−1 degree polynomial, according to the following relation $$\underline{x}[t_0+1]=A\cdot\underline{x}[t_0]+\underline{b}\cdot u[t_0]$$

where $\underline{x}$ is the state vector of the LFSR of dimension (n,1), and $\underline{u}$ is the incoming data vector, hence $$\underline{x}[t_0+(i+1)\cdot w]=A^w\cdot\underline{x}[t_0+i\cdot w]+B_w\cdot\underline{u}_w[t_0+i\cdot w] \quad [1]$$

where $A^w$ is a matrix (n,n) and $B_w$ is a matrix (n,w), the CRC being calculated by means of the following relation $$CRC=\underline{x}[t_0+(k/w)\cdot w]=\underline{x}[p\cdot w] \quad [2]$$

at least one external CRC (C1 of FIG. 1) covers incoming binary data of length k (where k=p·w and p is the number of w bit data words) $\underline{u}_w[t_0], \underline{u}_w[t_0+1], \underline{u}_w[t_0+2], \ldots, \underline{u}_w[t_0+h], \ldots, \underline{u}_w[t_0+h+c-1], \ldots, \underline{u}_w[t_0+p-1]$, of which a subsequence $\underline{u}_w[t_0+h], \ldots, \underline{u}_w[t_0+h+c-1]$ (C2 of FIG. 1) is unknown until instant (to+k−1). According to this method the external CRC (C1) is calculated by means of the following steps:

calculation of a preliminary value V, equal to $$V=f(\underline{x}[t_0],\underline{u}_w[t_0],\underline{u}_w[t_0+1], \ldots, \underline{u}_w[t_0+h-1],\underline{0}\\ [t_0+h], \ldots, \underline{0}[t_0+h+c-1], \underline{u}_w[t_0+h+c], \ldots,\\ \underline{u}_w[t_0+p-1])$$
[1st term of [9]]

calculation of a projection contribution PRJ, equal to $$PRJ(l,\underline{u}_w[t_0+h], \ldots, \underline{u}_w[t_0+h+c-1])$$
[2nd term of [9]]

sum of the preliminary value V and the projection contribution PRJ.

Preferably, if k is not a multiple of w, firstly the matrix form [1] is iterated m times to get the state $\underline{x}[t_0+m\cdot w]$, and then it is used as the initial state in the following formula operating on k−m·w bit parallel data:

$$\underline{x}[t_0+k]=A^{k-w\cdot m}\cdot\underline{x}[t_0+m\cdot w]+B_{k-m\cdot w}\cdot\underline{u}_{k-m\cdot w}[t_0+m\cdot w] \quad [1A]$$

where m is the integer part of k/w, and k−m·w is the remainder of the division of k by w.

Another specific item of this invention is a machine for checking and calculating the CRCs and checksums, including:

A frame processor (3, 4, 5, 6) for each protocol of a stack including at least two protocols; at least one frame processor is due to calculate a CRC.

At least one predictor (7), for calculating the projection contribution PRJ of the method according to claims 1 and 2.

One or more Operand Registers (8) for storing the operands of the instructions that must be executed by the aforesaid processors of the machine.

A CDT memory (9) for recording the instructions that must be executed by the aforesaid processors of the machine.

A state machine FSM (19) that reads the instructions from the CDT (9), compiles them and generates control signals.

A buffer (13) for storing the packets to be processed.

A data register set (Data Regs) (14) that stores the calculated CRC or checksum values.

For each processor (3, 4, 5, 6) and at least one predictor (7):

A Barrel-Shifter register (15) enabling the processing of words contained in two consecutive locations of the buffer (13), and A selector circuit (16) that selects data to be processed between those coming from the buffer (13) and those coming from the Data Regs (14); control signals of Barrel-Shifter registers (15) and selector circuits (16) are provided by the aforesaid FSM machine (10).

Preferably, at least one processor (3, 4) of the frame calculates a checksum; the machine includes a Rotate circuit (17) preceding the aforesaid checksum processor (3, 4); control signals of Rotate circuit (17) are also provided by the aforesaid FSM machine. (10).

BRIEF DESCRIPTION OF THE SEVERAL VIEWS OF THE DRAWINGS

This invention will now be described, for illustration purposes, but not limited to such illustration, according to its preferred forms of realization, with particular reference to Figures of the attached drawings, in which:

FIG. 1 schematically shows a protocol stack including two nested protocols;

FIG. 2 schematically shows the CRCs computation time of the stack in FIG. 1, according to the methods of the known art;

FIG. 3 schematically shows a packet divided according to the method of the invention;

FIG. 4 schematically shows the CRCs computation time of the stack in FIG. 1, according to the method of this invention;

FIG. 5 schematically shows the CRCs computation time of a protocol stack referred to a real application, including three nested protocols, according to the method of this invention;

FIG. 6 shows a preferred mode to implement the machine, according to the invention;

FIG. 7 schematically shows a first component of the machine of FIG. 6;

FIG. 8 shows a detail of the first component of FIG. 7;

FIG. 9 shows an example of the detail of FIG. 8;

FIG. 11 shows the values of certain components of the machine of FIG. 6 as the examples of FIG. 9 and of FIG. 10 describe;

FIG. 12 shows an example of a packet processed with the machine of FIG. 6;

FIG. 13 schematically shows a second component of the machine of FIG. 6;

FIG. 14 shows an example of a part of the packet processed by the second component of FIG. 13;

FIG. 15 shows the principle used to calculate a checksum over a packet;

FIG. 16 schematically shows how a third component of the machine of FIG. 6 works;

FIG. 17 shows a section of a packet processed by the second component of FIG. 13 and the third component of FIG. 16, as another example.

DETAILED DESCRIPTION OF THE INVENTION

Figure 10:
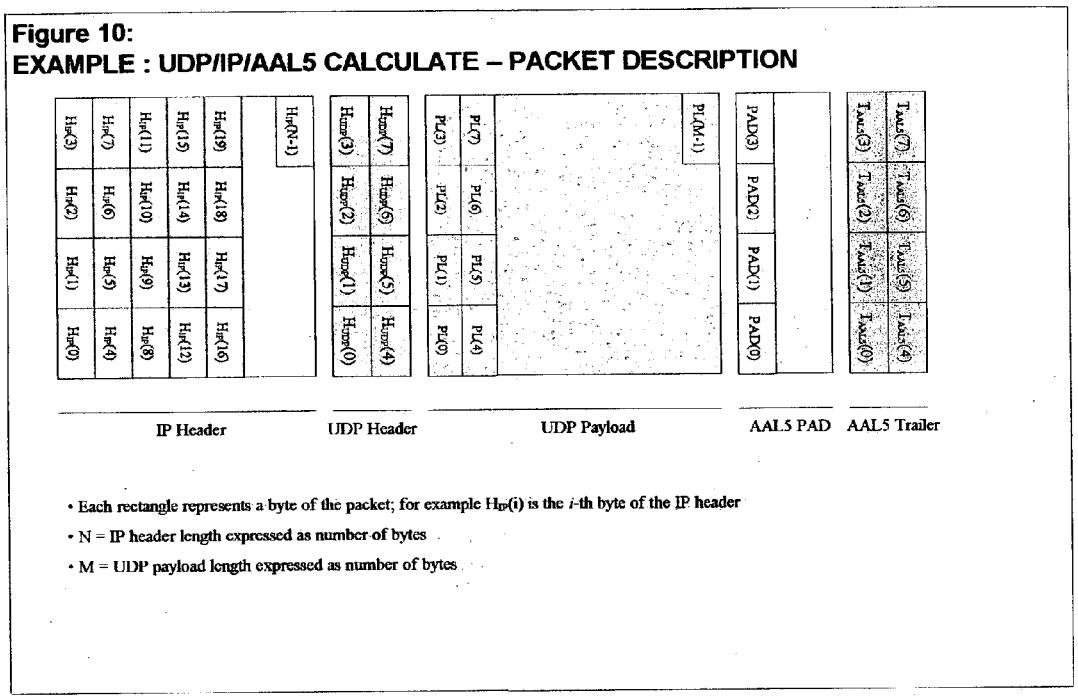
FIG. 10 shows a schematization of the packet, highlighting the relative lengths and positions of its various fields, according to which the values of certain components of the machine of FIG. 6 must be programmed.

The references of the description will be used to indicate the same elements as in the Figures.

FIG. 3, section 1, shows a generic section of a packet, represented as a w bit words sequence of total length p. Three subsections, respectively of lengths h, c and l, are defined in this section.

The main point of the problem solved by the invention is calculation of a CRC on the whole section of length p, assuming the subsections of length h and l are available first, and afterwards the subsection of length c. It is then basic to this invention to show how the CRC calculation may be subdivided into a calculation over the subsections h and l and a calculation over the subsection of length c.

The inventors have developed a new method for calculating the CRC that can be advantageously applied to the generation of CRCs in the transmission of stacked packets. In fact, if $$h+c+l=p, \text{ and } h, c, l>0$$

from the formula [0] we get the following equation [3]:

$$\begin{aligned}
x[p \cdot w] &= x[(h+c+l) \cdot w] \\
&= A^{(h+c+l) \cdot w} \cdot x[0] + \sum_{i=0}^{h+c+l-1} A^{(h+c+l-1-i) \cdot w} \cdot B_w \cdot \underline{u}_w[i \cdot w] \\
&= A^{(h+c+l) \cdot w} \cdot x[0] + \sum_{i=0}^{h-1} A^{(h+c+l-1-i) \cdot w} \cdot B_w \cdot \underline{u}_w[i \cdot w] + \\
&\quad \sum_{i=h}^{h+c-1} A^{(h+c+l-1-i) \cdot w} \cdot B_w \cdot \underline{u}_w[i \cdot w] + \\
&\quad \sum_{i=h+c}^{h+c+l-1} A^{(h+c+l-1-i) \cdot w} \cdot B_w \cdot \underline{u}_w[i \cdot w]
\end{aligned}$$

where four terms are shown:
- The first one, not depending on the inputs, is the contribution of the initial state to the calculation of the CRC under examination.
- The second one represents the contribution of a part of length h of the data of the packet to the calculation of the CRC under examination. With reference to FIG. 1, it is H1+H2.
- The third one is the contribution of the c length data section, not available at the moment of calculation, to the computation of the CRC under examination. For example, it could be the FCS field of a protocol that is nested in the one over which the CRC is being calculated. With reference to FIG. 1, it is C2.
- The fourth one is the contribution of the length l data section of the packet to the calculation of the considered CRC. With reference to FIG. 1, it is P2+T2+T1 (C1 is not an input but a result for the machine performing the current calculation).

This representation is shown in section 2 of FIG. 3. By gathering the first, second and fourth term, we obtain the equation [4]:

$$\left\{ A^{(h+c+l) \cdot w} \cdot \underline{x}[0] + \sum_{i=0}^{h-1} A^{(h+c+l-1-i) \cdot w} \cdot B_w \cdot \underline{u}_w[i \cdot w] + \right.$$

$$\left. \sum_{i=h+c}^{h+c+l-1} A^{(h+c+l-1-i) \cdot w} \cdot B_w \cdot \underline{u}_w[i \cdot w] \right\} +$$

-continued $$\left\{ \sum_{i=h}^{h+c-1} A^{(h+c+l-1-i) \cdot w} \cdot B_w \cdot \underline{u}_w[i \cdot w] \right\} \text{ where:}$$

The first term represents the contribution of the data known at the time of calculation.

The second term represents the contribution of the data not available at the time of the CRC calculation.

Equation [4], applying summand properties, leads to the following expression [5]:

$$\left\{ A^{(h+c+l) \cdot w} \cdot \underline{x}[0] + \sum_{i=0}^{h-1} A^{(h+c+l-1-i) \cdot w} \cdot B_w \cdot \underline{u}_w[i \cdot w] + \right.$$

$$\sum_{i=h+c}^{h+c+l-1} A^{(h+c+l-1-i) \cdot w} \cdot B_w \cdot \underline{u}_w[i \cdot w] \right\} +$$

$$\left\{ \sum_{i=h}^{h+c-1} A^{(h+c+l-1-i) \cdot w} \cdot B_w \cdot \underline{u}_w[i \cdot w] \right\} =$$

$$\left\{ A^{(h+c+l) \cdot w} \cdot \underline{x}[0] + \sum_{i=0}^{h-1} A^{(h+c+l-1-i) \cdot w} \cdot B_w \cdot \underline{u}_w[i \cdot w] + \right.$$

$$\sum_{i=h+c}^{h+c+l-1} A^{(h+c+l-1-i) \cdot w} \cdot B_w \cdot \underline{u}_w[i \cdot w] \right\} +$$

$$\left\{ \sum_{i=0}^{c-1} A^{(h+c+l-1-(i+h)) \cdot w} \cdot B_w \cdot \underline{u}_w[(i+h) \cdot w] \right\} =$$

$$\left\{ A^{(h+c+l) \cdot w} \cdot \underline{x}[0] + \sum_{i=0}^{h-1} A^{(h+c+l-1-i) \cdot w} \cdot B_w \cdot \underline{u}_w[i \cdot w] + \right.$$

$$\sum_{i=h+c}^{h+c+l-1} A^{(h+c+l-1-i) \cdot w} \cdot B_w \cdot \underline{u}_w[i \cdot w] \right\} +$$

$$\left\{ A^{l \cdot w} \cdot \sum_{i=0}^{c-1} A^{(c-1-i) \cdot w} \cdot B_w \cdot \underline{u}_w[(i+h) \cdot w] \right\}$$

The following expression [6] is obtained from [5] by adding the sequence of null inputs $\underline{0}_w$ between h and h+c−1:

$$\left\{ A^{(h+c+l) \cdot w} \cdot \underline{x}[0] + \sum_{i=0}^{h-1} A^{(h+c+l-1-i) \cdot w} \cdot B_w \cdot \underline{u}_w[i \cdot w] + \right.$$

$$\sum_{i=h}^{h+c-1} A^{(h+c+l-1-i) \cdot w} \cdot B_w \cdot \underline{0}_w + \sum_{i=h+c}^{h+c+l-1} A^{(h+c+l-1-i) \cdot w} \cdot B_w \cdot \underline{u}_w[i \cdot w] \right\} +$$

$$\left\{ A^{l \cdot w} \cdot \sum_{i=0}^{c-1} A^{(c-1-i) \cdot w} \cdot B_w \cdot \underline{u}_w[(i+h) \cdot w] \right\}$$

Equation [5], which represents the value of the CRC, equates to [6].

Defining the sequences of inputs $\underline{u}_w^*$ and $\underline{u}_w^\#$ as:

$$u_w^*[i \cdot w] = \begin{cases} 0 & h \leq i \leq h+c-1 \\ \underline{u}_w[i \cdot w] & \text{otherwise} \end{cases}$$

$$u_w^\#[i \cdot w] = \begin{cases} \underline{u}_w[i \cdot w] & h \leq i \leq h+c-1 \\ 0 & \text{otherwise} \end{cases}$$

and by introducing them in [6], we obtain the following equation:

$$\left\{ A^{(h+c+l) \cdot w} \cdot \underline{x}[0] + \sum_{i=0}^{h+c+l-1} A^{(h+c+l-1-i) \cdot w} \cdot B_w \cdot \underline{u}_w^*[i \cdot w] \right\} + \quad [7]$$

$$\left\{ \sum_{i=0}^{h+c+l-1} A^{(h+c+l-1-i) \cdot w} \cdot B_w \cdot \underline{u}_w^\#[i \cdot w] \right\} =$$

$$\left\{ A^{(h+c+l) \cdot w} \cdot \underline{x}[0] + \sum_{i=0}^{h+c+l-1} A^{(h+c+l-1-i) \cdot w} \cdot B_w \cdot \underline{u}_w^*[i \cdot w] \right\} +$$

$$\left\{ A^{l \cdot w} \sum_{i=0}^{h+c+l-i} A^{(h+c+l-1-i) \cdot w} \cdot B_w \cdot \underline{u}_w^\#[i \cdot w] \right\}$$

Both equations [7] and [3] express the value of CRC, but [7] highlights that the result may be obtained as a sum of two terms, the first one is calculated by applying [3] to the particular sequence of inputs $\underline{u}_w^*$, that is characterized by null vectors between h and h+c−1, and the second one is calculated over the complementary sequence $\underline{u}_w^\#$, characterized by null vectors between 0 and h−1 and between h+c and h+c+l−1 with a null initial state.

As regards implementation, the calculation is performed as shown by the following expression, obtained from [6] by introducing $\underline{u}_w^*$ in the first term:

$$\left\{ A^{(h+c+l) \cdot w} \cdot \underline{x}[0] + \sum_{i=0}^{h+c+l-1} A^{(h+c+l-1-i) \cdot w} \cdot B_w \cdot \underline{u}_w^*[i \cdot w] \right\} + \quad [8]$$

$$\left\{ A^{l \cdot w} \cdot \sum_{i=0}^{c-1} A^{(c-1-i) \cdot w} \cdot B_w \cdot \underline{u}_w^\#[(i+h) \cdot w] \right\}$$

This corresponds to summing the results of two partial CRC calculations: the first one is performed on the whole input sequence, whose input vectors between h and h+c−1 are replaced with $0_w$; the second one is calculated over the input sequence evaluated between h and h+c−1, starting from a null initial state and multiplied by the factor $A^{l \cdot w}$. The latter operation is called projection.

This linear property of the matrix calculation may be applied in the generation of a CRC C1 of an external protocol embedding an internal protocol as shown in FIG. 4. As a general premise for the interpretation of the figure, the section H1+H2 represents the first known data of length h in the preceding treatment, while P2+T2+T1 represents the second known data of length l in the preceding treatment; C2 instead represents the unknown section of length c. The length of each section is meant to be the number of w bit parallel words, while its calculation time is the product of the number of its words and the computer clock period.

Thus, for example, the length of the internal CRC field, C2, is c words (section duration is $T_c = c \cdot T_{clock}$). In FIG. 4, the internal CRC C2 is placed between a first portion, H1+H2 long (C1 is ignored because it is the result to be calculated), and a second portion P2+T2+T1 long. Thus, the CRC C1 can be obtained from the following formula $$CRC = f(\underline{x}[t_0], \underline{u}_w[t_0], \underline{u}_w[t_0+1], \ldots, \underline{u}_w[t_0+h-1], \\ \underline{0}[t_0+h], \ldots, \underline{0}[t_0+h+c-1], \underline{u}_w[t_0+h+c], \ldots, \\ \underline{u}_2[t_0+p-1]) + prj(l, \underline{u}_w[t_0+h], \ldots, \underline{u}_w[t_0+h+c-1]) \quad [9]$$

where:

The function f equates to the first term of equation [8].

The function prj, called projection, equates to the second term of equation [8], expressed in FIG. 4 as $PRJ_{C2} = PRJ(t_{P2}+t_{T2}, C2)$, where $t_{P2}+t_{T2}$ is the projection length l used in matrix $A^{l \cdot w}$.

The 1st term is called V and the 2nd term is called PRJ.

The projection function depends on the projection length l (=p−h−c) and on the unknown c long data u in section C2. The expression of prj, according to the second term of [8], is $$prj(l, u[t_0+h], \ldots, u[t_0+h+c-1]) = \quad [10]$$

$$A^{l \cdot w} \cdot \sum_{i=0}^{c-1} A^{(c-1-i) \cdot w} \cdot B_w \cdot \underline{u}_w^\#[(i+h) \cdot w]$$

In other words, the external CRC C1 results from the sum of the first term of [8], applied on the whole input sequence $\underline{u}[t_0], \ldots, \underline{u}[t_0+p-1]$, where the input words from instant $t_0+h$ to instant $t_0+h+c-1$, corresponding to the internal CRC C2, are replaced with the c long null sequence, and the projection contribution [10] of $u[t_0+h], \ldots, u[t_0+h+c-1]$, corresponding to the internal CRC C2, where l=p−h−c is the projection length, that is the distance between instant ($t_0+h+c$) of the missing input sequence and instant ($t_0+p-1$) of the last data word involved in external CRC C1 calculation. With reference to FIG. 4, this is expressed by the term $C1 = C1_0 + PRJ_{C2}$, where $C1_0 = f(X0_2, H1, H2, 0, P2, T2, T1)$.

In this way, the generation time of the external CRC C1 is extremely reduced. In fact, with reference to FIG. 4, the calculator of CRC C1, instead of waiting for the result of the internal CRC C2 calculation, keeps on working as well as these words were null; only when C2 becomes available, its contribution to the CRC C1 generation can be obtained through the projection formula [10] and can be added to the contribution of all remaining data through the formula [9]. The time saving in the external CRC C1 computation is approximately equal to the length of the data of the most internal protocol that are covered by CRC C2 and that follow C2 itself.

As an example, but not as a limitation in any way, FIG. 5 shows a real case (unlike in FIG. 4, it's a CRC at AAL5 protocol level while there is a checksum in the nested protocol IP/UDP), suitable to apply the method of this invention and referred to an UDP/IP/AAL5 stack based frame, where:

AAL5 protocol has a CRC-32 field, for transmission control purposes, covering the whole frame, including the IP and UDP protocols;

IP protocol uses a checksum placed in its header and covering only the IP protocol header itself;

UDP protocol performs error checking through a checksum placed in its header and covering the whole datagram.

When AAL5 CRC calculator processes the IP checksum, the projection method is not particularly useful. In fact, the amount of time saved is not significant because the length of data, covered by the IP checksum and following it, is restricted to the second section IP-H2 of the header; therefore, it would be better to stop the CRC-AAL5 computing machine until the IP checksum becomes available.

In a different way, when the UDP checksum is being processed, the method of this invention can give a big advantage. In fact, the amount of time saved during the computation is the length of the UDP payload: this length may be up to 64 k octets and thus, if we consider N bytes parallel data, the computing time saving is about 64 k/N clock cycles.

FIG. 6 shows a preferred form of implementation of a machine for checking and computing CRCs and checksums according to this invention. In particular, the machine includes a frame processor for each of four protocols of the stacks taken into consideration, and namely a UDP processor 3, an IP processor 4, and Eth processor 5 and an AAL5 processor 6: the UDP and IP processors, 3 and 4, calculate their checksums, while the Eth and AAL5 processors, 5 and 6, calculate their CRCs. The machine also includes a predictor 7 that implements the projection method for calculating the CRC according to this invention.

Every single packet is characterized by fixed information, such as the CRC position in the frame, and other variable information depending on packets, such as stack type, header and payload lengths. The variable information is carried by an informative unit, called Tag, 11, associated with each packet, and is stored in dedicated registers, named Operand Regs 8. Calculation control is performed by loading a program in a memory called CDT 9 (CRC/checksum Description Table), containing encoded instructions to be executed by every single processor of the machine. In particular, the CDT 9 is a memory containing several sections, one for each processed protocol stack. Each section contains the instructions that must be executed by each CRC or checksum processor. The values of the operands of these instructions are stored in the Operand Regs 8, some of which are written by the Tag while others contain fixed information. As an illustration, if the CDT 9 indicates that a certain processor must carry out the CRC computing instruction on a portion of the data packet, the number of bytes on which to carry out the calculation is read by the FSM 10 block in one of the OperandRegs 8, whose address is written in the instruction taken from the CDT 9.

The FSM 10 block is a finite state machine that reads the instructions from the CDT 9 and "compiles" them, generating the signals for controlling the processors and the dataflow.

The data frame 12 pass through a buffer 13 which has a number of ports equal to the number of processors, such that each processor 3, 4, 5, 6, and 7 can access a different data. The word that must be processed may come from the aforesaid buffer 13 or from a Data Regs 14, storing the CRC or checksum values calculated by each processor. As an illustration, when the AAL5 calculator processes the IP checksum, then this data will be fetched from register 14 where it has been written by the IP processor.

The data coming from the buffer 13 go through a Barrel-Shifter 15, through which the system can process words, with a pre-defined width, even when a word is contained in two consecutive locations of the buffer 13. In particular, for each processor 3, 4, 5, 6, and 7, the machine contains one Barrel-Shifter 15 and one selector circuit 16 selecting data to be sent to its own processor between those coming from the buffer 13 and those coming from the Data Regs 14.

Bytes of data processed by blocks 3 and 4, computing the checksum, may be rotated; Rotate circuit 17 performs this operation, in order to give the bytes the right weight during the one's complement sum, as checksum generation requires.

In particular, as described below, the FSM 10 block generates the control signals of the Barrel-Shifters 15, of the selector circuits 16, and of the Rotate circuits 17. The machine in FIG. 6 works even though the length of the packet to be processed is not an integer multiple of the usual data width. As an illustration, but not as a limitation in any way, assuming a 32 bit data width, packet length may not be a multiple of 4 bytes. As regards the computation of a checksum, padding is carried out by adding "0" (neutral element of the sum) for the missing bits. Padding cannot be carried out during CRC calculation, however, because the result would be wrong. CRC processors 5 and 6 thus contain 4 sub-blocks, one for each data width, namely 1, 2, 3 and 4 bytes: the 4-byte data width block will work nearly always, while the others will do for reduced data width. For example, in case of 37 bytes packet length, data width will be the fullest for 9 clock cycles, while the remaining byte will feed through the block working 1 byte at a time.

With reference to FIG. 7, all the instructions for each CRC or checksum or projection processor depend on the set of possible protocol stacks. They are written in the program memory CDT 9 during component initialization.

CDT 9 is divided into sections 18, one for every protocol stack taken into consideration. The section to be used for processing a certain frame is addressed by a Stack_Id pointer 19, carried by the Tag 11 referring to that packet.

The section 18 for each single stack includes the Stack Length 20, which specifies the number of protocols composing the stack itself. The number of rows in each section is given by the value of the Stack Length 20; End of Line (EOL 24) code separates rows from each other.

With reference to FIG. 8, showing the single section 18 in detail, notice that each row is characterized by a machine identification code (Machine_ID) 21 indicating which computation block should carry out the instructions stored in the row itself. Each instruction is encoded by OP_Code 22; following fields in a row contain the addresses of the registers where operands, associated with the same instruction, are stored. The CDT does not contain the explicit values of the operands because some of them are variable from packet to packet (for example, frame length itself). As already mentioned, each row ends with an EOL 24.

FIG. 9 shows an example of compilation of a single section regarding UDP/IP/AAL5 stack. Each instruction contains the addresses of the Operand Regs 8. In particular, the Figure shows the following instructions:

CALC (Op Len, Dt Sel, [Reg Addr]), for which the related processor carries out the CRC or Checksum calculation, where Op Len is the operation length (as number of bytes), Dt Sel is the selector between the buffer 13 and (Dt Sel=0) and DataRegs 14 (Dt Sel=1), and Reg Addr is the optional address of the DataRegs 14;

SKIP (Op Len), for which the related processor skips the incoming data, where Op Len is the operation length (as number of bytes). The use of the SKIP instruction may be illustrated with reference to FIG. 4. More specifically, during the CRC C1 calculation, C1 field doesn't contribute to the calculation itself; for this reason, it is skipped via the SKIP instruction;

NULL IN (Op Len), for which the related processor carries out the calculation with a null input, where Op Len is the operation length (as number of bytes). With reference to FIG. 4, NULL IN is used when the projection method is applied. During the calculation of CRC C1, CRC C2 is replaced with zeros because it is not yet available when it should be processed; this corresponds to process the function $\underline{u}_w$* already defined and characterized by a null sequence in C2 field position. NULL IN instruction causes null sequence insertion. With reference to FIG. 5, during IP-CHK checksum calculation, a NULL IN is carried out to process a null sequence instead of IP-CHK, since zero is the neutral element with respect to the checksum operation;

WAIT (Op Len), for which processing is disabled and the last calculated value is stored; Op Len is the operation length (as number of bytes). With reference to FIG. 4, the WAIT instruction is used to suspend processing while waiting for the result of the projector. With reference to FIG. 5, after having processed IP-H1, the AAL5 CRC computer starts a WAIT operation to wait for the completion of the IP-CHK checksum calculation;

ADD (Data Value), for which the related processor carries out the logical operation of XOR of its result and the Data Value data, coming from another processor (namely, the projector). With reference to FIG. 4, the ADD instruction carries out the sum of the two terms of equation [8], where the first term is the state of the CRC computer after processing the sequence $\underline{u}_w$* while the second term is the result of the projection operation;

PREDICT (Prj Len, Data Value), for which the predictor 7 carries out the projection operation, where PrjLen is the projection length and Data Value is the data to be projected. With reference to FIGS. 4 and 5, the result of the PREDICT operation corresponds to the second term of equation [8].

The SKIP operation differs from the WAIT one. In fact, the SKIP operation does not process a given number of bytes. Moreover it does not cause buffering of not processed data. The WAIT operation suspends the calculation, but causes a buffering of not processed data, and enables a following CALC operation to process them later (in this case, a pointer records the position of last data before WAIT execution).

FIG. 10 is a representation of UDP/IP/AAL5 frame, as shown in the non-limiting example of FIG. 5, that supports in the description of the next Figures.

FIG. 11 shows the content of the OPERAND REGS 8 and DATA REGS 14 registers, in the same case.

The FSM 10 block includes one compiler for each processor. The compiler reads the CDT 9 row that it refers to and generates the control signals for its own processor. With reference to FIG. 12, each compiler includes the following pointers:

PKTCNT, which is an index of the bytes of the whole frame passing through the input port of the machine, including data that the compiler must ignore. This pointer is not active during the WAIT operation, but it is during SKIP.

DTPCNT, which is a counter of the bytes processed by the machine. This pointer is different from PKTCNT, because it is not active during SKIP. Nevertheless, like PKTCNT, it stops during WAIT.

BUFPNT, which is a pointer to the data of the Buffer 13 to be sent to the machine. It indicates the delay—expressed as number of clock cycles—from input to output of the Buffer 13. During the WAIT operation, this pointer indicates the byte where the operation following WAIT should start.

With reference to FIG. 6, some other pointers are:

BSHSEL, which is a selector of the Barrel-Shifter 15 for the 4-byte width data, ranges from 0 to 3 and indicates how many bytes of the previous location of the buffer contribute to the current data word.

ROTSTEP, which is the byte rotation factor of the word to be processed; it's used by the Rotate circuits 17, during checksum calculation by the processors 3 and 4, to give bytes the right weight the one's complement sum requires;

The following equations are true for the described pointers:

$$BSHSEL=((-PKTCNT)_4)$$

$$ROTSTEP=(DTPCNT)_4$$

$$BUFPNT=Int(PKTCNT/4)$$

Where the ( )$_m$ operator is defined as:

$$(n)_m = \begin{cases} \text{remainder of } n/m & \text{if } n \geq 0 \\ m - (-n)_m & \text{if } n < 0 \end{cases}$$

Int is the operator "integer part of".

FIG. 13 shows a preferred mode to implement a barrel-shifter 15. It allows the elaboration of a 32-bit data word, even when the processed word is shared by two consecutive packet words. The selectors 26 choose each byte of the output word between the current frame word and the last one, from the input interface 25. The FSM 10 generates BSHSEL control signal. To allow the selection, a three-registers delay line 27 (D type Flip-Flop based) has been put into the circuit connecting the input interfaces 25 to the selectors 26.

As shown in FIG. 14, if data directed towards the processor start, for example, from the eleventh byte b10 of the packet, then the word exiting the Barrel Shifter must be made up of bytes b10, b11 b12, b13, so PKTCNT and BSHSEL values are:

PKTCNT=10, and

BSHSEL=2

BSHSEL thus selects 2 bytes, b10 and b11, from the old word and two bytes, b12 and b13, from the new one, and collects them together to compose the output word.

As an example of checksum calculation, FIG. 15 helps to understand why the Rotate circuits 17, shown in the next FIG. 16, have been introduced. The checksum is a 16-bit word (two bytes: C0 and C1) obtained from the one's complement of the one's complement sum of all the 16-bit words involved in checksum calculation.

Bytes C0 and C1 of the checksum are initially set to 0. At time t=0, the sum of the 16-bit words [b0, b1] and [b2, b3] increments the initial value; the result, at time t=1, is incremented by the sum of the 16-bit words [b4, b5] and [b6, b7].

Note that the checksum value depends on the position of the bytes within the word to be processed (as shown in the example of FIG. 17). That's why the Rotate circuits 17 are introduced.

As already mentioned, the Rotate circuits 17 restore the right order of bytes in calculating a checksum. FIG. 16 shows the rotation logic of the preferred mode to implement the Rotate circuits 17.

As an illustration, consider the situation shown in FIG. 17, where the checksum processor must calculate the 16-bit one's complement sum of all the 32-bit words of the packet, where the most significant bytes are b0, b4, b8, . . . , while the least significant ones are b3, b7, b1, . . . , and bytes from b0 to b6 have already been processed. If PKTCNT=DTPCNT=7, and BSHSEL=1 (that selects the least significant byte of the previous word and the three most significant bytes of the current one)

then, at the output of the Barrel-Shifter 15 we obtain the word b7, b8, b9, b10. Without rotation, the checksum computer would incorrectly consider b7 to be the most significant byte instead of the least significant one. If

ROTSTEP=3 the Rotate circuit 17 restores the right weight of the bytes of the word to be processed.

Generally, when the machine calculates a checksum, the bytes fetched from a register, if required, are rotated according to the following rule:

$$ROTSTEP = (DTPCNT)_4$$

This invention has been disclosed by describing the preferred forms of realization with some suggested variations, but it should be understood that modifications and changes may be made by the persons skilled in the art without departing from the scope of the invention as defined in the appended claims.

The invention claimed is:

1. An automated method for generating the Cyclic Redundancy Check, or CRC, of a data packet, particularly for the transmission of packets recursively embedded in packet-switching networks, where a CRC is calculated by means of a linear feedback shift register, or LFSR, carrying out the calculation of a n-degree polynomial according to the following formula $$\underline{x}[t_0 + 1] = A \cdot \underline{x}[t_0] + \underline{b} \cdot u[t_0]$$

where $\underline{x}$ is the LFSR state vector of size (n,1), and $\underline{u}$ is the incoming vector, for which $$\underline{x}[t_0 + (i+1) \cdot w] = A^w \cdot \underline{x}[t_0 + i \cdot w] + B_w \cdot \underline{u}_w[t_0 + i \cdot w] \quad [1]$$

where $A^w$ is a (n,n) matrix and $B_w$ is a (n,w) matrix, the CRC being calculated by means of the following formula $$CRC = \underline{x}[t_0 + (k/w) \cdot w] = \underline{x}[p \cdot w] \quad [2]$$

wherein the method of calculating at least one external CRC covering incoming binary data $\underline{u}_w[t_0]$, $\underline{u}_w[t_0+1]$, $\underline{u}_w[t_0+2]$, . . . , $\underline{u}_2[t_0+h]$, . . . , $\underline{u}_w[t_0+h+c-1]$, . . . , $\underline{u}_w[t_0+p-1]$, of length k (where k=p·w, p being the number of w-bit data words), in which a data sequence $\underline{u}_w[t_0+h]$, . . . , $\underline{u}_w[t_0+h+c-1]$ is unknown until the instant $(t_0+k-1)$, comprising the following steps:

calculating a preliminary value V, equal to $$V = f(\underline{x}[t_0], \underline{u}_w[t_0], \underline{u}_w[t_0+1], \ldots, \underline{u}_w[t_0+h-1], \underline{0}[t_0+h], \ldots, \underline{0}[t_0+h+c-1], \underline{u}_w[t_0+h+c], \ldots, \underline{u}_w[t_0+p-1]);$$

calculating a projection contribution PRJ, equal to $$PRJ(1, \underline{u}_w[t_0+h], \ldots, \underline{u}_w[t_0+h+c-1]);$$

generating said external CRC value by calculating the sum of the preliminary value and of the projection contribution PRJ.

2. A method according to claim 1, in case k is not a multiple integer of w, further comprising the steps of:

first iterating m times the matrix form [1] to reach the state $\underline{x}[t_0+m \cdot w]$, and then using it as the initial state in the following formula operating k−m·w bits a time:

$$\underline{x}[t_0 + k] = A^{k-m \cdot w} \cdot \underline{x}[t_0 + m \cdot w] + B_{k-m \cdot w} \cdot \underline{u}_{k-m \cdot w}[t_0 + m \cdot w] \quad [1A]$$

where m is the integer part of k/w, and k−m·w is the remainder of k/w.

3. A checking and computing machine for CRCs and checksums, including:

A frame processor for each protocol of multi-protocol stacks, at least one processor of the frame being a CRC calculator;

At least one predictor calculating the projection contribution PRJ of the method according to claim 1

One or more registers, Operand Regs, in order to store the operands of the instructions to be executed by the processors and by the predictor A CDT memory in order to store encoded instructions to be executed by the processors and by the predictor A finite state machine FSM, fetching the instructions from the CDT and compiling them to generate control signals A buffer to store the packets to be processed A Data Regs register where the calculated CRC or checksum are stored For each of the said processors and of the said at least one predictor:

A Barrel-Shifter register, enabling the processing of words shared by two consecutive locations of the buffer, and A selector circuit, selecting data to be processed from the buffer or from the Data Regs, the FSM machine generating the control signals of the Barrel-Shifters and of the selector circuits.

4. A finite state machine according to claim 3, characterized by including at least one checksum calculation processor, a Rotate circuit feeding input data through the said at least one checksum calculation processor, and the finite state machine FSM generating the control signals of the said Rotate circuit.

5. A checking and computing machine for CRCs and checksums, including:

A frame processor for each protocol of multi-protocol stacks, at least one processor of the frame being a CRC calculator;

At least one predictor calculating the projection contribution PRJ as it is calculated in the method according to claim 2

One or more registers, Operand Regs, in order to store the operands of the instructions to be executed by the processors and by the predictor A CDT memory in order to store encoded instructions to be executed by the processors and by the predictor A finite state machine FSM, fetching the instructions from the CDT and compiling them to generate control signals A buffer to store the packets to be processed A Data Regs register where the calculated CRC or checksum are stored For each of the said processors and of the said at least one predictor:

A Barrel-Shifter register, enabling the processing of words shared by two consecutive locations of the buffer, and A selector circuit, selecting data to be processed from the buffer or from the Data Regs, the FSM machine generating the control signals of the Barrel-Shifters and of the selector circuits.

6. A finite state machine according to claim 5, characterized by including at least one checksum calculation processor, a Rotate circuit feeding input data through the said at least one checksum calculation processor, and the finite state machine FSM generating the control signals of the said Rotate circuit.

* * * * *